(12) United States Patent
Johnson

(10) Patent No.: US 7,719,298 B2
(45) Date of Patent: *May 18, 2010

(54) FULL-WAFER TEST AND BURN-IN MECHANISM

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/272,717

(22) Filed: Nov. 17, 2008

(65) Prior Publication Data

US 2009/0284274 A1 Nov. 19, 2009

Related U.S. Application Data

(63) Continuation of application No. 11/810,950, filed on Jun. 6, 2007, now Pat. No. 7,453,277.

(60) Provisional application No. 60/811,508, filed on Jun. 6, 2006.

(51) Int. Cl.
*G01R 31/02* (2006.01)
(52) U.S. Cl. .................... 324/760; 324/158.1
(58) Field of Classification Search .............. None
See application file for complete search history.

(56) References Cited

U.S. PATENT DOCUMENTS 5,767,690 A * 6/1998 Fujimoto .................. 324/760

* cited by examiner

*Primary Examiner*—Paresh Patel
(74) *Attorney, Agent, or Firm*—Raymond J. Werner

(57) ABSTRACT

Assemblies include a substrate, such as a printed circuit board, with a first array of contact pads disposed thereon; a guide ring structure disposed on the substrate and at least partially surrounding the first array of contact pads; a translator socket disposed on the first array of contact pads, the translator socket adapted to receive the tester side of a translated wafer; a thermally conductive, conformal, heat spreading cushion adapted to be disposed over the backside of a wafer; a cover plate adapted to fit over the first array of contact pads, align with the guide ring structure, contain within it the various components disposed over the first array of contact pads, and removably attach to the substrate; and a bolster plate adapted to removably attach to a second side of the substrate. In a further aspect a translated wafer is disposed over the translator socket such that the tester side of the translator is in contact with the translator socket; and the heat spreading cushion is disposed over the backside of the translated wafer. In a still further aspect, the substrate includes signal communication means, such as but not limited to, an edge connector adapted to couple to various controller circuits, which are typically disposed on a printed circuit board.

14 Claims, 6 Drawing Sheets

Prior Art

Prior Art

FULL-WAFER TEST AND BURN-IN MECHANISM

CROSS-REFERENCE TO RELATED APPLICATIONS

This non-provisional application is a continuation of U.S. application Ser. No. 11/810,950, filed 6 Jun. 2007 now U.S. Pat. No. 7,453,277, entitled "Methods and Apparatus For Full-Wafer Test And Burn-In Mechanism"; which claimed the benefit of U.S. Provisional Application No. 60/811,508, filed 6 Jun. 2006, entitled "Methods and Apparatus For Full-Wafer Test And Burn-In Mechanism"; the entirety of both are hereby incorporated by reference.

FIELD OF THE INVENTION

The present invention relates generally to semiconductor test equipment, and more particularly relates to testing integrated circuits at predetermined temperatures prior to those integrated circuits being singulated.

BACKGROUND

Subsequent to fabrication of wafers having many integrated circuits formed thereon, it is a common practice to test the functionality and electrical characteristics of those integrated circuits while still in wafer form. That is, well-known semiconductor processes are used to perform a variety of operations on a wafer, culminating in the formation of a plurality of integrated circuits, which are typically cut apart so that individual integrated circuits may be put into protective packages, or otherwise incorporated into products. However, in order to prevent the packaging, or other use, of integrated circuits that may have manufacturing defects, the wafer is coupled to one or more test systems to verify that the integrated circuits contained in that wafer, perform according to the specifications associated with those integrated circuits.

Conventionally, electrical connection between a test system and the individual integrated circuits, sometimes referred to as die, is made via a probe card. These probe cards provide a first mechanism to electrically interface, or connect, with a test system, and a second mechanism to physically touch and electrically connect with the very small contact pads exposed at a top surface of each integrated circuit. This second mechanism typically consists of probes, sometimes referred to as probe needles, that must be precisely shaped, aligned, and the tips of which must be positioned in a co-planar manner so that the probe tips all touch the contact pads of an integrated circuit without being short of the target pad, and without driving too deeply into the pad.

Subsequent to testing the individual integrated circuits on the wafer, those integrated circuits that have successfully passed testing, are packaged and then re-tested. This re-testing of the packaged integrated circuits, sometimes referred to as "final test", may be used to determine whether the assembly operations of packaging have resulted in a part that does not function properly, or may be used for conveniently testing the integrated circuits in environmentally challenging settings, such as for example, elevated temperatures. Operating, or testing, an integrated circuit at elevated temperature is sometimes referred to as burn-in. Such burn-in testing may identify integrated circuits that do not function according to their specifications. Unfortunately, detecting failures after an integrated circuit has been packaged results in higher costs for a manufacturer than if such a failure could have been detected while the integrated circuit was still in wafer form.

What is needed are methods and apparatus for wafer-level, that is pre-singulation, testing of the integrated circuits on a wafer that is operated within a user defined temperature range.

SUMMARY OF THE INVENTION

Briefly, assemblies in accordance with the present invention include a substrate, such as a printed circuit board, with a first array of contact pads disposed thereon; a guide ring structure disposed on the substrate and at least partially surrounding the first array of contact pads; translator socket disposed on the first array of contact pads, the translator socket adapted to receive the tester side of a translated wafer; a thermally conductive, conformal, heat spreading cushion adapted to be disposed over the backside of a wafer; a cover plate adapted to fit over the first array of contact pads, align with the guide ring structure, contain within it the various components disposed over first array of contact pads, and removably attach to the substrate; and a bolster plate adapted to removably attach to a second side of the substrate.

In a further aspect of the present invention, a translated wafer is disposed over the translator socket such that the tester side of the translator is in contact with the translator socket; and the heat spreading cushion is disposed over the backside of the translated wafer.

In a still further aspect of the present invention, the substrate includes signal communication means, such as but not limited to, an edge connector adapted to couple to various controller circuits, which are typically disposed on a printed circuit board.

DETAILED DESCRIPTION

Figure 1:
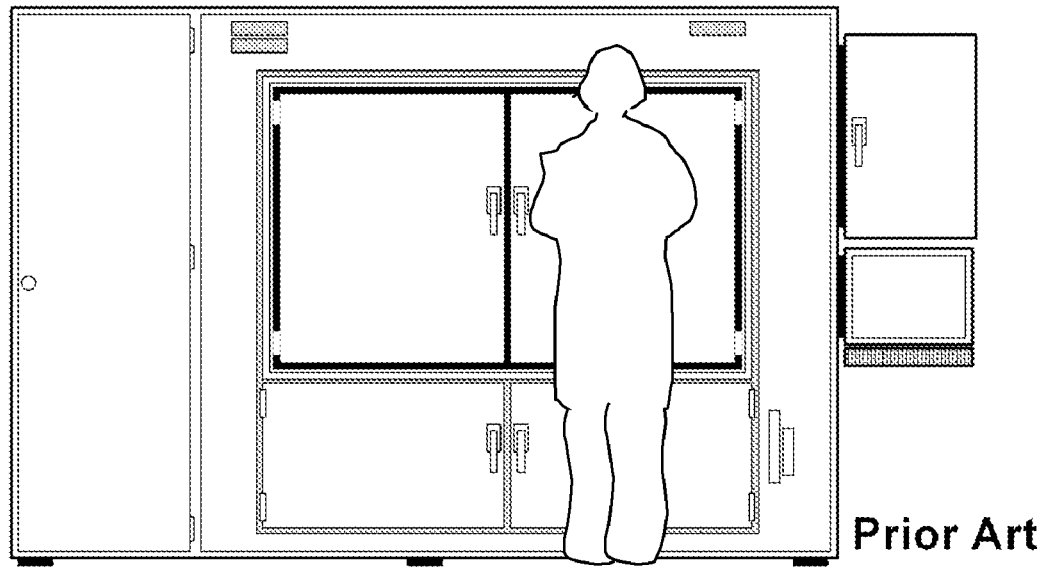
FIG. 1 is an exterior view of a burn-in oven conventionally used for providing a high-temperature, or burn-in, environment for packaged semiconductor components.
Figure 3:
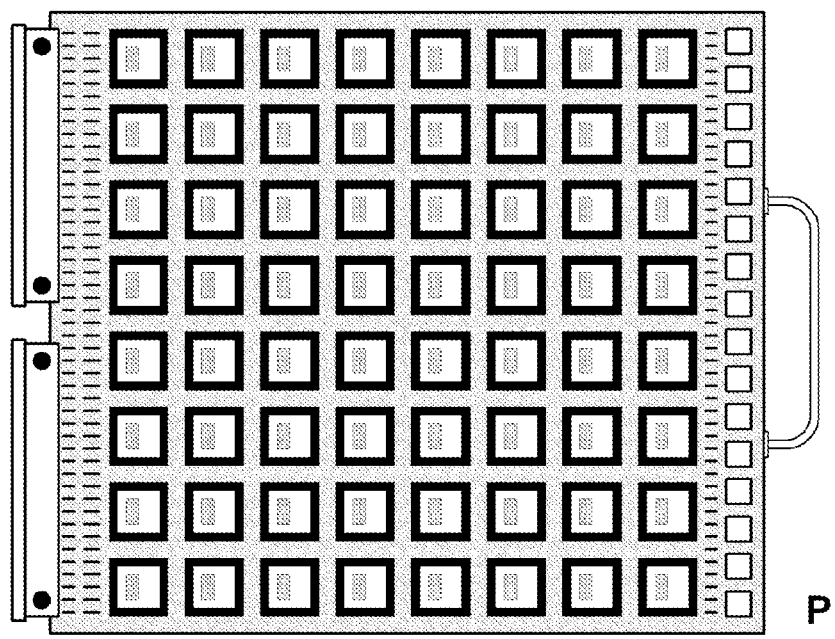
FIG. 3 shows a conventional burn-in board, which contains an array of components to be tested, or at least powered, while at an elevated temperature in a burn-in oven.
Figure 2:
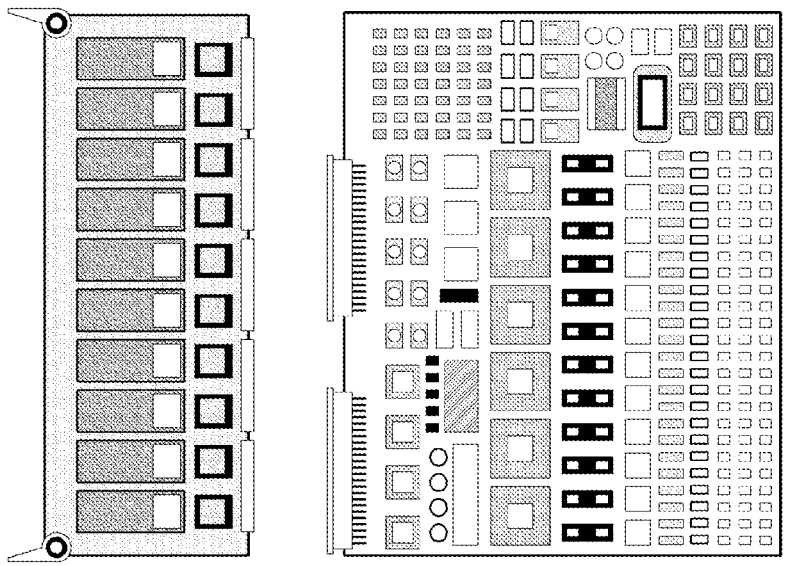
FIG. 2 shows two conventional circuit boards that are used for conventional burn-in processes.

Various embodiments of the present invention provide methods and apparatus for conducting burn-in of wafer form, i.e., unsingulated, integrated circuits. These various embodiments are suitable for use with conventional controller boards but eliminate the need for burn-in ovens.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is typically used to form a physical connection terminal for communicating signals to and/or from the integrated circuit.

The expression "wafer translator" refers to an apparatus facilitating the connection of I/O pads (sometimes referred to as terminals, pads, contact pads, bonding pads, chip pads, or test pads) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator may be disposed between a wafer and other electrical components. The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the I/O pads of the integrated circuits on the wafer. The wafer translator, when disposed between a wafer and other electrical components, makes electrical contact with one or more I/O pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning.

The expression "translated wafer" refers to a wafer that has a wafer translator attached thereto, wherein a predetermined portion of, or all of, the contact pads of the integrated circuits on the wafer are in electrical contact with corresponding electrical connection means disposed on the wafer side of the translator. Typically, the wafer translator is removably attached to the wafer. Removable attachment may be achieved by means of vacuum, or pressure differential, attachment.

The expressions "burn-in socket for wafers", "wafer burn-in socket", and "translator socket", refer to a component adapted to be disposed upon a first array of contact pads, to make electrical contact with the individual terminals of that first array of contact pads, and to make electrical contact with a plurality of contact pads on the topside, also referred to as the "tester side", of a wafer translator. The translator socket comprises an insulating body with contact pads disposed on each major surface, and further having interconnections through that insulating body to provide electrical connection between the contact pads on one side with corresponding pads on the other side. Although the term "socket" is used, the translator socket is not limited to a configuration in which insertion of terminals into the translator socket is required. In other words, the translator socket may take the form of an interposer with contact pads on each major surface thereof, and in which electrical contact is made by urging counterpart contact pads, or terminals, of the substrate and/or the non-wafer-side of the translator into contact with the translator socket.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

FIGS. 1-5 illustrate conventional components and arrangements used for burin-in operations with packaged integrated circuits.

Figure 4:
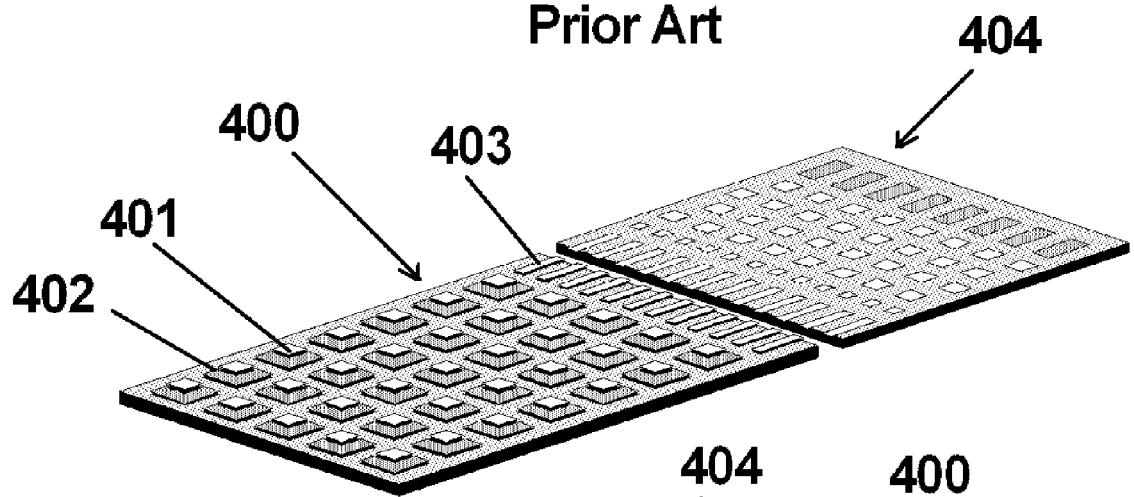
FIG. 4 is an illustration of a conventional burn-in board loaded with components for testing at elevated temperatures, and further shows a conventional controller board, which, in operation, is coupled to the burn-in board, and which transmits and receives various signals to and from the burn-in board.

Referring to FIG. 4, a burn-in board 400 includes integrated circuits 401 coupled to sockets 402, which are disposed on burn-in board 400. Burn-in board 400 further includes edge connector 403, which is adapted to couple to controller board 404.

Figure 5:
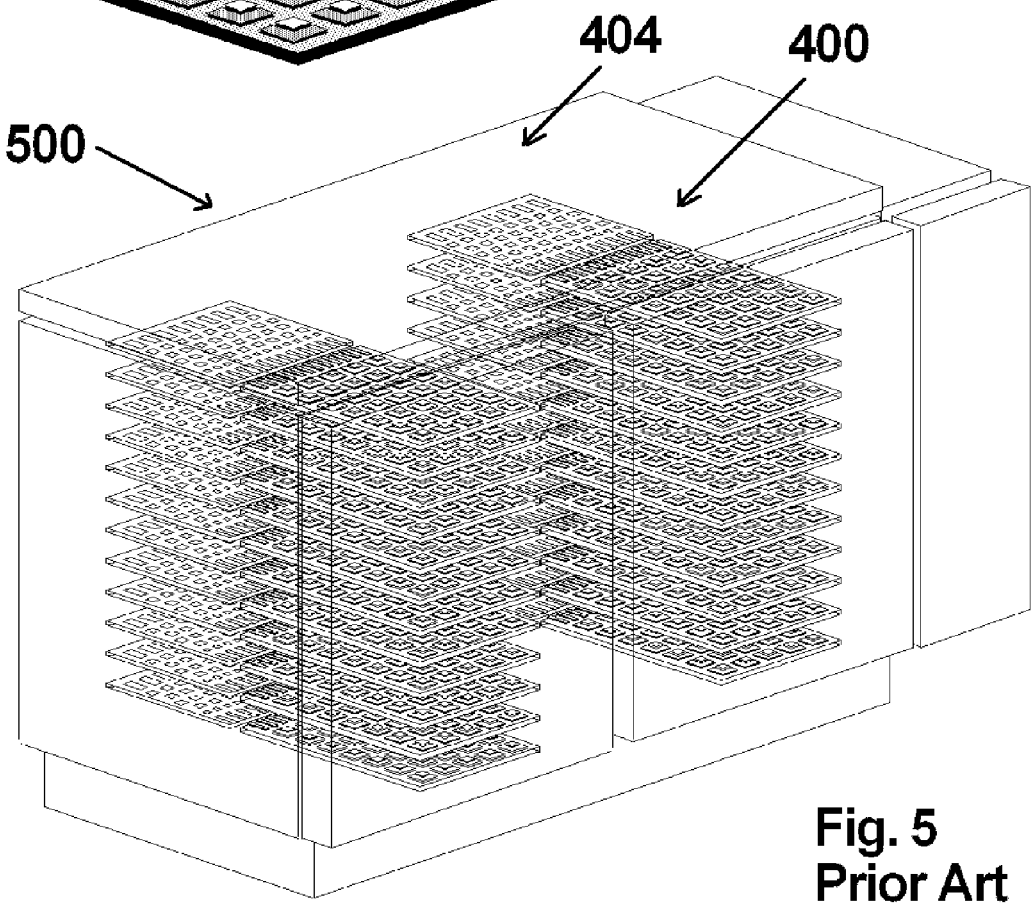
FIG. 5 illustrates a conventional arrangement of stacks of burn-in board/controller board pairs disposed within a burn-in oven system.

FIG. 5 shows stacks of burn-in boards 400 paired with controller boards 404, where the stacks are disposed within a conventional burn-in oven 500.

Various embodiments of the present invention provide methods and apparatus for wafer-level burn-in that allows for use of conventional controller boards and burn-in ovens.

Figure 6:
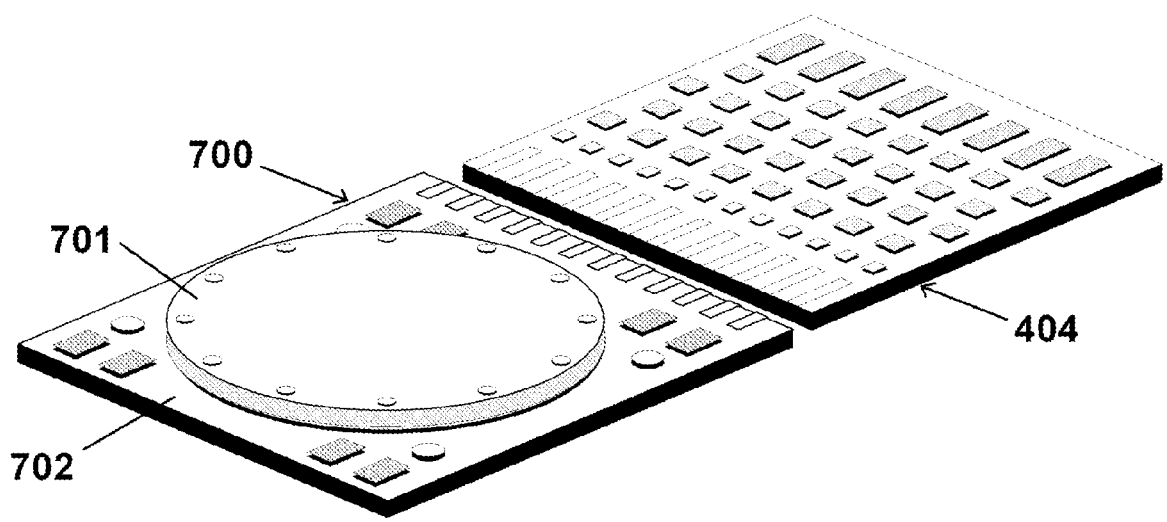
FIG. 6 illustrates a wafer-level test and burn-in assembly, in accordance with the present invention, and further shows a pair of controller boards suitable for coupling to the wafer-level test and burn-in assembly.

Referring to FIG. 6, a wafer-level burn-in board assembly 700, in accordance with the present invention, is shown juxtaposed to controller board 404. Wafer-level burn-in board assembly 700, includes a translated wafer (not shown), under cover 701, disposed on a wafer-level burn-in board 702. Wafer-level burn-in board assembly 700, may alternatively be referred to as a wafer-level burn-in assembly.

Figure 7:
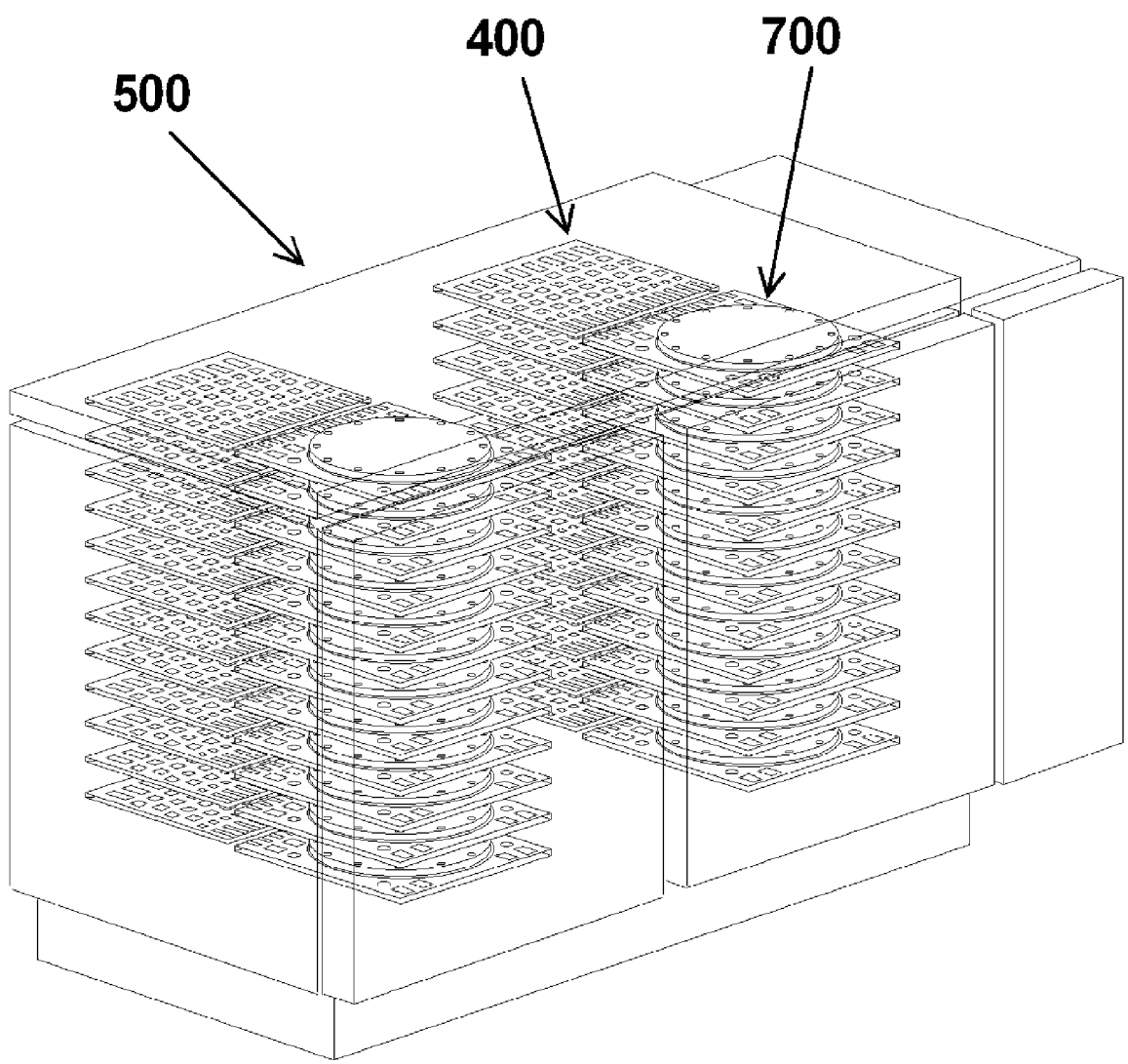
FIG. 7 illustrates an arrangement of stacks of wafer-level test and burn-in assemblies, in accordance with the present invention, each assembly coupled to corresponding controller boards.

FIG. 7 shows stacks of wafer-level burn-in assemblies 700 paired with controller boards 404, where the stacks are disposed within burn-in oven 500.

Figure 8:
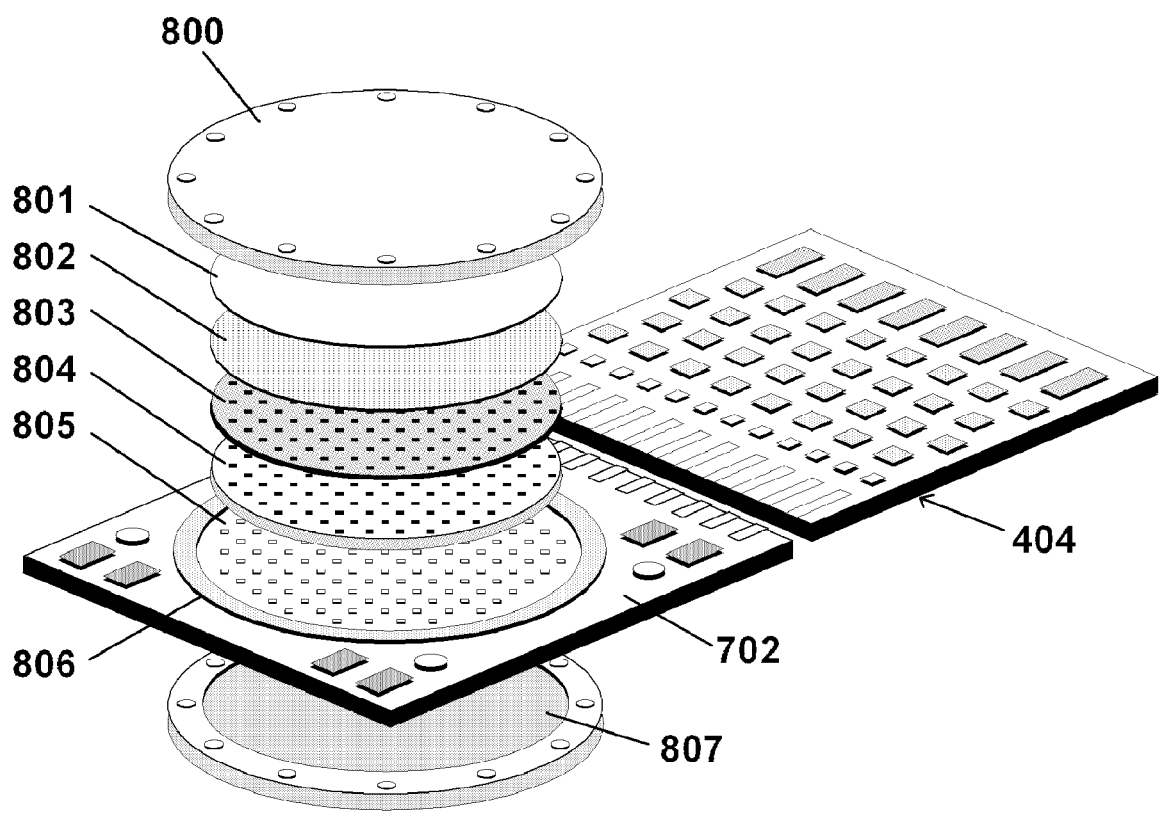
FIG. 8 is an exploded view of the wafer-level test and burn-in assembly including a base cover, a first edge-extended substrate, a first translator socket, a first translator, a first wafer, a first head spreader, a heat source, a second heat spreader, a second wafer, a second translator, a second edge-extended substrate, and a top cover.

Referring to FIG. 8, an exploded view of wafer-level burn-in assembly 700 is shown. Wafer-level burn-in assembly 700 of FIG. 8 includes a bolster plate 807, a wafer-level burn-in board 701, a guide ring structure 806, a first array of contact pads 805, a wafer burn-in socket 804, a wafer translator 803, a wafer 802, a heat spreader 801, and a cover 800.

As shown in FIG. 8, a wafer-level burn-in board 702 has a first area within which are disposed a first array of contact pads 805. Contact pads 805 are adapted to make electrical contact with a corresponding set of contact pads disposed on a wafer burn-in socket 804. At least a portion of contact pads 805 are coupled, by way of electrically conductive pathways, to various contact pads of the edge connector of burn-in board 701. It will be appreciated that an electrical pathway between any one of contact pads 805 and a corresponding edge connector pad, may be made by a single conductive line, or by a combination of conductive line segments coupled disposed on two or more layers and electrically connected by vias, or plated through holes, or any other suitable means of electrically connecting conductive lines on different layers of a printed circuit or other substrate.

Heat spreader 801 is a thermally conductive cushion characterized by the ability to transfer heat between at least the cover and the wafer. Heat spreader 801 is typically disposed such that it is in physical contact with both the backside of wafer 802 and with cover 800. In this way, heat from the burn-in oven can be transferred through cover 800 to wafer 802. Typically, heat transfer through heat spreader 801 is not uni-directional, and therefore heat from wafer 802 may also be transferred through heat spreader 801 to cover 800 when the difference in temperatures supports such transfer.

Still referring to FIG. 8, guide ring structure 806 is disposed on wafer-level burn-in board 702 outside the first area. In the illustrative embodiment of FIG. 8, guide ring structure 806 is round, but the present invention is not limited to any particular geometric layout, and may take forms such as, but not limited to, ovals, squares and rectangles. Guide ring structure 806 is a continuous structure in FIG. 8, but alternative embodiments may be implemented wherein guide ring structure 806 is discontinuous. Guide ring structure 806 provides a seat for cover 800, and provides holes through which cover 800 may be screwed to bolster plate 807. Bolster plate 807 acts as a mechanical stiffener, and may further act to provide a means, such as threaded holes, for the attachment of cover 806 by screws. Bolster plate 807 is typically made of metal, but is not so limited, and may be fabricated from any material or combination of materials capable of providing the aforementioned characteristics of stiffening and/or anchoring the attachment of cover 800. It is noted that a variety of alternative attachment configurations may be used to attach cover 800 and bolster plate 807 to wafer-level burn-in assembly 700.

In one embodiment of the present invention, a wafer-level burn-in assembly, includes:

a circuit board having a first major surface and a second major surface;

a first plurality of contact pads disposed in a first area of the first major surface of the circuit board, the first plurality of contact pads arranged in first pattern;

a guide ring disposed on the first major surface of the circuit board such that the guide ring is outside the first area;

a wafer burn-in socket having a first major surface and a second major surface, the first major surface having a plurality of contact pads arranged in a second pattern that matches the first pattern, the second major surface having a plurality of contact pads arranged in a third pattern, the first major surface of the wafer burn-in socket disposed on the circuit board;

a wafer translator having a first major surface and a second major surface, the first major surface having a plurality of contact pads arranged in a fourth pattern that matches the third pattern, the first major surface of the wafer translator disposed on the wafer burn-in socket;

a wafer attached to the second major surface of the wafer translator;

a heat spreader disposed against a side of the wafer facing away from the translator; and a cover disposed over the heat spreader.

In another embodiment, a wafer-level burn-in assembly includes:

a circuit board having a first major surface and a second major surface;

a first plurality of contact pads disposed in a first area of the first major surface of the circuit board, the first plurality of contact pads arranged in first pattern;

a guide ring disposed on the first major surface of the circuit board such that the guide ring is outside the first area;

a wafer burn-in socket having a first major surface and a second major surface, the first major surface having a plurality of contact pads arranged in a second pattern that matches the first pattern, the second major surface having a plurality of contact pads arranged in a third pattern, the first major surface of the wafer burn-in socket disposed on the circuit board;

a wafer translator having a first major surface and a second major surface, the first major surface having a plurality of contact pads arranged in a fourth pattern that matches the third pattern, the first major surface of the wafer translator disposed on the wafer burn-in socket;

a wafer removably attached to the second major surface of the wafer translator;

a heat spreader disposed against a side of the wafer facing away from the translator; and a cover disposed over the heat spreader and in physical contact with the guide ring.

CONCLUSION

Various embodiments of the present invention include apparatus and methods for providing wafer level, i.e., pre-singulation, testing of integrated circuits, at predetermined temperatures.

Embodiments of the present invention may find application in the field of semiconductor circuit testing.

An advantage of some embodiments of the present invention includes testing integrated circuits at elevated temperatures while still in wafer form in a manner that is compatible with existing burn-in equipment, including burn-in ovens and controller boards, that are adapted for burn-in testing of individually packaged integrated circuits.

It is to be understood that the present invention is not limited to the embodiments described above, but encompasses any and all embodiments within the scope of the subjoined Claims and their equivalents.

What is claimed is:

1. A wafer-level burn-in assembly, comprising:

a circuit board having a first major surface and a second major surface;

a first plurality of contact pads disposed in a first area of the first major surface of the circuit board, the first plurality of contact pads arranged in first pattern;

a guide ring disposed on the first major surface of the circuit board such that the guide ring is outside the first area;

a wafer burn-in socket having a first major surface and a second major surface, the first major surface having a plurality of contact pads arranged in a second pattern that matches the first pattern, the second major surface having a plurality of contact pads arranged in a third pattern, the first major surface of the wafer burn-in socket disposed on the circuit board;

a wafer translator having a first major surface and a second major surface, the first major surface having a plurality of contact pads arranged in a fourth pattern that matches the third pattern, the first major surface of the wafer translator disposed on the wafer burn-in socket;

a wafer attached to the second major surface of the wafer translator;

a heat spreader disposed against a side of the wafer facing away from the translator;

a cover disposed over the heat spreader; and a controller board coupled to the circuit board.

2. The wafer-level burn-in assembly of claim 1, wherein the controller board and the circuit board are disposed within a burn-in oven.

3. The wafer-level burn-in assembly of claim 2, further comprising a first plurality of circuit boards coupled to corresponding ones of a first plurality of controller boards, each of the coupled pairs of circuit boards and controller boards are disposed within the burn-in oven and spatially arranged to form one or more stacks.

4. The wafer-level burn-in assembly of claim 1, further comprising a bolster plate disposed on the second major surface of the circuit board.

5. The wafer-level burn-in assembly of claim 1, wherein the guide ring comprises two or more discontinuous segments.

6. The wafer-level burn-in assembly of claim 4, wherein the guide ring has holes therethrough through which the cover is screwed to the bolster plate.

7. The wafer-level burn-in assembly of claim 1, wherein the circuit board has an edge connector comprising a plurality of contact pads each of which is electrically coupled to a corresponding one of the first plurality of contact pads disposed in the first area of the first major surface of the circuit board.

8. A wafer-level burn-in assembly, comprising:

a circuit board having a first major surface and a second major surface;

a first plurality of contact pads disposed in a first area of the first major surface of the circuit board, the first plurality of contact pads arranged in first pattern;

a guide ring disposed on the first major surface of the circuit board such that the guide ring is outside the first area;

a wafer burn-in socket having a first major surface and a second major surface, the first major surface having a plurality of contact pads arranged in a second pattern that matches the first pattern, the second major surface having a plurality of contact pads arranged in a third pattern, the first major surface of the wafer burn-in socket disposed on the circuit board;

a translated wafer having a first surface comprising a wafer backside and a second surface comprising a wafer translator tester-side;

a heat spreader disposed against a side of the wafer facing away from the translator;

a cover disposed over the heat spreader;

a controller board coupled to the circuit board.

9. The wafer-level burn-in assembly of claim 8, wherein the controller board and the circuit board are disposed within a burn-in oven.

10. The wafer-level burn-in assembly of claim 9, further comprising a first plurality of circuit boards coupled to corresponding ones of a first plurality of controller boards, each of the coupled pairs of circuit boards and controller boards are disposed within the burn-in oven and spatially arranged to form one or more stacks.

11. The wafer-level burn-in assembly of claim 8, further comprising a bolster plate disposed on the second major surface of the circuit board.

12. The wafer-level burn-in assembly of claim 8, wherein the guide ring comprises two or more discontinuous segments.

13. The wafer-level burn-in assembly of claim 11, wherein the guide ring has holes therethrough through which the cover is screwed to the bolster plate.

14. The wafer-level burn-in assembly of claim 8, wherein the circuit board has an edge connector comprising a plurality of contact pads each of which is electrically coupled to a corresponding one of the first plurality of contact pads disposed in the first area of the first major surface of the circuit board.

* * * * *